(12) United States Patent
Howell

(10) Patent No.: US 9,989,557 B2
(45) Date of Patent: Jun. 5, 2018

(54) SYSTEM AND METHOD FOR ANALYZING ELECTRONIC DEVICES HAVING OPPOSING THERMAL COMPONENTS

(71) Applicant: Exatron, Inc., San Jose, CA (US)

(72) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 678 days.

(21) Appl. No.: 14/624,489

(22) Filed: Feb. 17, 2015

(65) Prior Publication Data

US 2015/0160263 A1  Jun. 11, 2015

Related U.S. Application Data

(63) Continuation-in-part of application No. 13/628,594, filed on Sep. 27, 2012, now abandoned.

(51) Int. Cl.
*G01R 31/20* (2006.01)
*G01R 1/04* (2006.01)
*G01K 13/00* (2006.01)
*G01R 31/28* (2006.01)

(52) U.S. Cl.
CPC ........... *G01R 1/0408* (2013.01); *G01K 13/00* (2013.01); *G01R 31/28* (2013.01); *G01R 31/2867* (2013.01); *G01R 31/2874* (2013.01); *G01R 31/2893* (2013.01)

(58) Field of Classification Search
CPC .... G01R 1/0433; G01R 1/0408; G01R 31/28; G01R 31/2874; G01R 31/2893; G01R 31/2867
See application file for complete search history.

(56) References Cited

U.S. PATENT DOCUMENTS

| 5,596,282 A * | 1/1997 | Giddings | G01R 1/0433 |
| | | | 324/750.22 |
| 8,466,705 B1 * | 6/2013 | Howell | G01R 1/0408 |
| | | | 324/756.01 |

* cited by examiner

*Primary Examiner* — Minh N Tang
(74) *Attorney, Agent, or Firm* — Stephen M. De Klerk

(57) ABSTRACT

A system for analyzing electronic devices is described. An input station receives a plurality of electronic devices. A pick-and-place transport apparatus having a pick up tip for engaging and transporting one of the electronic devices at a time from the input station to the electric machine interface station, disengaging from the electronic device, and moving away from the electronic device The pick up tip is movable for engaging the electronic device while at the electric machine interface station and transporting the electronic device away from the electric machine interface station to disengage the electronic devices from the electric machine interface. First and second thermal devices secured to the support structure on opposing sides of the electronic device when the electronic device is at the electric machine interface station to simultaneously transfer heat to or form the electronic device.

15 Claims, 6 Drawing Sheets

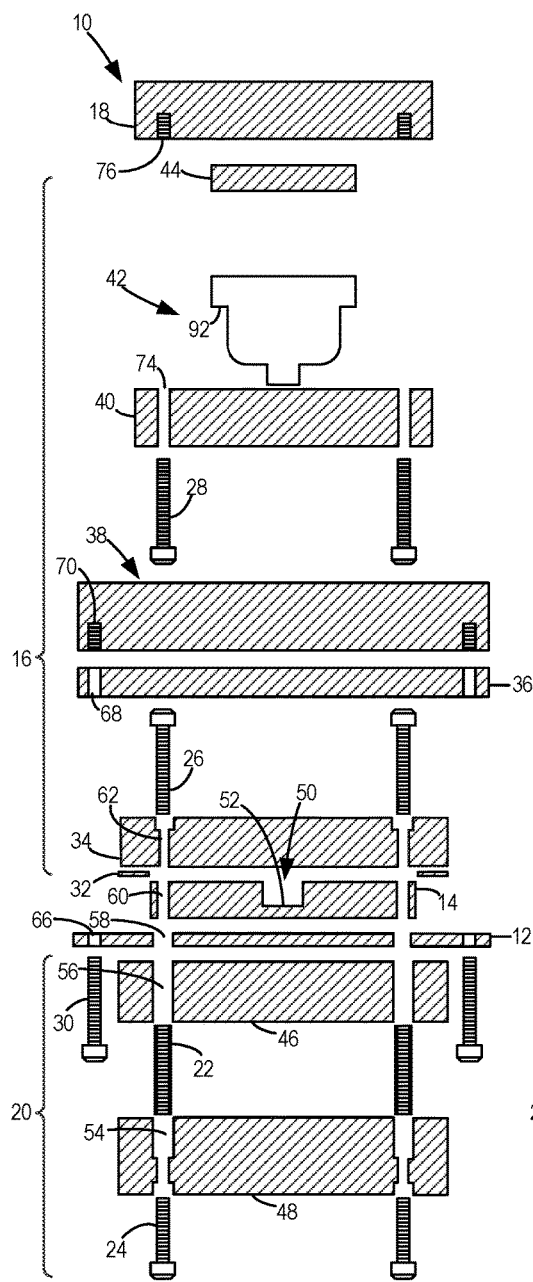
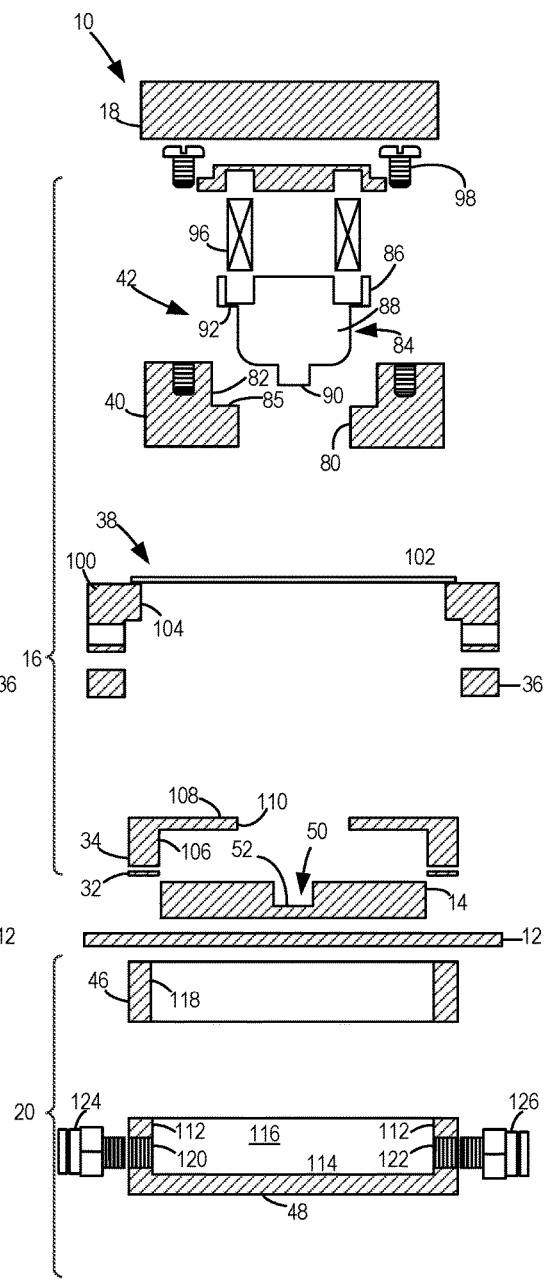
Fig 2
Fig 3

SYSTEM AND METHOD FOR ANALYZING ELECTRONIC DEVICES HAVING OPPOSING THERMAL COMPONENTS

CROSS-REFERENCE TO RELATED APPLICATIONS

This is a continuation-in-part of prior U.S. patent application Ser. No. 13/628,594, filed on Sep. 27, 2012 now abandoned, which is incorporated herein by reference in its entirety.

BACKGROUND OF THE INVENTION

1). Field of the Invention

This invention relates generally to a system and method for analyzing electronic devices, including determining a parameter of a measured electronic device.

2). Discussion of Related Art

Before electronic devices are packaged for shipping, it is often required to measure certain parameters of the electronic devices. The parameters may for example be used for programming the electronic devices or may be measured to determine correct functioning of the electronic devices.

A system that is used for analyzing electronic devices often includes a handler and an electric machine. The handler may for example have a bin where electronic devices are loosely deposited, a feed mechanism that feeds the devices one at a time and an electric machine interface station where one electronic device at a time is located against terminals of an electric machine interface. The electric machine is connected to the electric machine interface and can be used for programming the electronic devices, or first measuring frequencies of the electronic devices and then programming the electronic devices based on the frequencies.

It is often required that the electronic devices be analyzed at temperatures other than room temperature. These temperatures are usually achieved with a thermal device located at the electric machine interface station. Such a thermal device usually heats or cools only one side of the electronic devices thus resulting in a temperature profile from one side to an opposing side of the electronic device. Such a temperature profile makes it difficult to determine accurate measurements for the electronic device as it would perform under conditions where the temperature through the electronic device is uniform, for example under all steady state conditions.

U.S. patent application Ser. No. 13/628,594 describes a system for analyzing electronic devices includes an input station, a transport apparatus, an electric machine interface station, an electric machine interface, a support structure and first and second thermal components. The input station receives a cab with a plurality of electronic devices and the transport apparatus transports the cab with the electronic devices from the input station to the electric machine interface station. The electric machine interface engages the electronic devices when the electronic devices are at the electric machine interface station, and is disengageable from the electronic devices for the cab to be transportable by the transport apparatus away from the electric machine interface station. The first and second thermal components are located on opposing sides of the electronic device when the electronic device is at the electric machine interface station to simultaneously transfer heat to or from the electronic devices.

SUMMARY OF THE INVENTION

The invention provides a system for analyzing electronic devices including an input station configured to receive a plurality of electronic devices, a pick-and-place transport apparatus, an electric machine interface station, the pick-and-place transport apparatus having at least one pick up tip for engaging each of the electronic devices, transporting at least one of the electronic devices at a time from the input station to the electric machine interface station, disengaging from the electronic device, and moving away from the electronic device, an electric machine interface positioned to engage the electronic device when the electronic device is at the electric machine interface station from the electronic device, the at least one pick up tip being movable for engaging the electronic device while at the electric machine interface station and transporting the electronic device away from the electric machine interface station to disengage the electronic devices from the electric machine interface and first and second thermal devices secured to the support structure on opposing sides of the electronic device when the electronic device is at the electric machine interface station to simultaneously transfer heat to or form the electronic device.

The system may further include a tape feeder that feeds the electronic devices to an input station where the pick up tip engages with the electronic devices.

The system may further include that the input station is an input and output station and the pick up tip disengages from the electronic device at the input and output station after the electronic device is tested.

The system may further include that the first thermal device includes a thermal head that is movable between a disengaged position to allow for the pick up tip to transport the electronic device to the electric machine interface station and an engaged position wherein after the pick up tip is moved away from the electric machine interface station, engages with the electronic device.

The system may further include a thermal distribution piece that is located around the electric machine interface station, a thermal plate located around the thermal head, a backing plate secured to the thermal plate with a body of the thermal head between portions of the thermal plate and the backing plate and at least one spring between the thermal head and the backing plate, the spring biasing the thermal head so that a surface of the body of the thermal head rests on a surface of the thermal plate, a tip of the thermal head extending from the body of the thermal head making contact with the electronic device before the thermal plate makes contact with the thermal distribution piece, the thermal head moving towards the backing plate against a force of the spring until the thermal plate makes contact with the thermal distribution piece.

The system may further include a purge cover having an inlet and outlet located over the electric machine interface station. The purge cover may have a main piece and a door, the door being movable relative to the main piece between an open position and a closed position.

The system may further include that the second thermal device includes a thermal housing defining chamber having an inlet and an outlet, a heat exchange device having an inlet and an outlet, an outlet of the heat exchange device being connected to the inlet of the chamber, heat transferring between a fluid in the chamber and the electronic device.

The system may further include that a printed circuit board and a socket mounted to the printed circuit board, the socket defining the electric machine interface station.

The system may further include an electric tester connected through the printed circuit board to contacts in the socket.

The system may further include that the second thermal device includes a thermal housing, the thermal housing and a surface of the printed circuit board jointly defining the chamber.

The system may further include that the first and second thermal device are heaters The system may further include that the first and second thermal device are coolers.

The system may further include that the first and second thermal devices cool the electronic device to below 0° C.

The invention also provides a method of analyzing electronic devices including engaging at least one pick up of a pick-and place transport apparatus with each of a plurality of electronic devices, transporting at least one of the electronic devices at a time with the pick up tip from an input station to an electric machine interface station, disengaging the pick up tip from the electronic device, moving the pick up tip away from the electronic device to allow for testing of the electronic device, simultaneously transferring heat to and from first and second thermal components located on opposing sides of the respective electronic device when the respective electronic device is at the electric machine interface station, communicating signals between an electric machine and a circuit in the respective electronic device through the electric machine interface, moving the pick up tip to the electronic device, engaging the electronic device with the pick up tip while at the electric machine interface station and transporting the electronic device away from the electric machine interface station and transporting the electronic device with the pick up tip away from the electric machine interface station.

BRIEF DESCRIPTION OF THE DRAWINGS

The invention is further described by way of example with reference to the accompanying drawings, wherein:

FIG. 2 is a cross-sectional side view on 2-2 in FIG. 1;

FIG. 3 is a cross-sectional side view on 3-3 in FIG. 1;

DETAILED DESCRIPTION OF THE INVENTION

Figure 1:
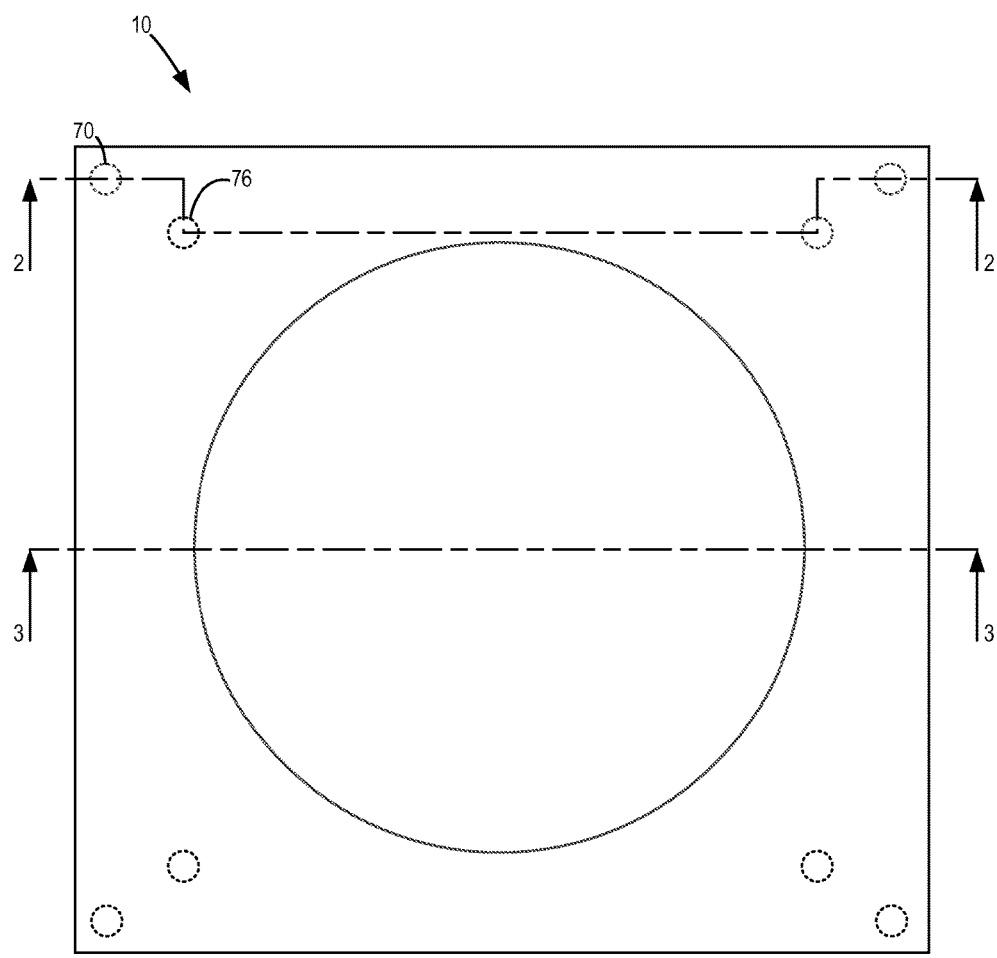
FIG. 1 is a top plan view of a system for analyzing electronic devices according to one embodiment of the invention.

FIG. 1 of the accompanying drawings illustrates a system 10 for analyzing electronic devices, according to an embodiment of the invention, in plan view. FIG. 2 illustrates the system 10 in cross-sectional side view on 2-2 in FIG. 1. FIG. 3 illustrates the system 10 in cross-sectional side view on 3-3 in FIG. 1.

As shown in FIG. 2, the system 10 includes a printed circuit board 12, a socket 14, a first thermal device 16, a movable mounting plate 18, a second thermal device 20, a plurality of internally threaded sleeves 22 and threaded screws 24, 26, 28 and 30.

The first thermal device 16 includes a thermally conductive gasket 32, a thermal distribution piece 34, a gasket 36, a purge cover 38, a thermal plate 40, a thermal head 42 and a backing plate 44.

The second thermal device 20 includes a thermally insulative gasket 46 and a thermal housing 48 made of a thermally insulative material.

The socket 14 has a recess forming an electric machine interface station 50 for placing an electronic device. An electric machine interface 52 is formed by contacts in a base of the electric machine interface station 50. The socket 14 is located on the printed circuit board 12 and is electrically connected thereto. Electric signals can conduct through conductors in the printed circuit board 12 to and from the contacts at the electric machine interface 52.

The thermal distribution piece 34 is placed on the printed circuit board 12 with the gasket 32 between the thermal distribution piece 34 and an upper surface of the printed circuit board 12. The thermal housing 48 is placed on a lower surface of the printed circuit board 12 with the gasket 46 between the thermal housing 48 and the printed circuit board 12. The thermal housing 48 has a plurality of openings 54 therein and the gasket 46 has a plurality of openings 56 that are aligned with the openings 54. Each sleeve 22 is located within a portion of an opening 54 and an opening 56. Referring to only the left side of the drawing, openings 58 are formed in the printed circuit board 12, socket 14 and thermal distribution piece 34, respectively. The openings 54, 56, 58, 60 and 62 are aligned with one another. One screw 24 is inserted into a bottom of the opening 54 and turned into the thread within the sleeve 22. One screw 26 is inserted into a top of the opening 62 and then through the openings 60, 58 and 56 and is turned into the thread within the sleeve 22. The screws 24 and 26 thereby secure the gasket 32, thermal distribution piece 34, gasket 46 and thermal housing 48 to the printed circuit board 12.

The purge cover 38 is located over the thermal distribution piece 34 on the printed circuit board 12 with the gasket 36 between the purge cover 38 and the printed circuit board 12. Openings 66, 68 and 70 are formed in the printed circuit board 12, gasket 36 and purge cover 38 such that one of the openings 66 is aligned with one of the openings 68 and one of the openings 70. The opening 70 is internally threaded. One screw 30 is inserted from below into the opening 66 and then through the opening 68. The screw 30 is then turned so that its thread turns into the thread of the opening 70. The purge cover 38 is thereby secured to the printed circuit board 12 with the gasket 36 between the purge cover 38 and the printed circuit board 12. In another embodiment the purge cover may not be mounted to the printed circuit board and be mounted to a hander of a pick-and place transport apparatus instead.

The thermal head 42 is inserted into the thermal plate 40 and the backing plate 44 is located above the thermal head 42. The backing plate 44 is then secured to the thermal plate 40 with the thermal head 42 held between the backing plate 44 and the thermal plate 40. Openings 74 and 76 are formed in the thermal plate 40 and the mounting plate 18. Each opening 76 is aligned with a respective opening 74. The openings 76 are internally threaded. One screw 28 is inserted from below into the opening 74. The screw 28 is then turned so that its thread turns into the thread of the opening 76. The thermal plate 40 is thereby secured to the mounting plate 18.

As shown in FIG. 3, the thermal plate 40 has a smaller opening 80 and a larger opening 82. A surface 85 connects the smaller opening 80 to the larger opening 82. The thermal head 84 has a base 86, a body 88 and a tip 90. The base 86 has a lower surface 92. The base 86 is larger than the smaller opening 80 so that the surface 92 rests on the surface 85.

The first thermal device 16 further has a plurality of springs 96 located between the thermal head 84 and the backing plate 44. The springs 96 are compressed when the backing plate 44 is pressed towards the thermal plate 40. Screws 98 secure the backing plate 44 to the thermal plate 40. The springs 96 then bias the body 88 so that the surface 92 remains on the surface 85.

The purge cover 38 has a main piece 100 and a door 102. The main piece 100 has an opening 104. The door 102 is movable between a position where the opening 104 is open and a position where the opening 104 is closed by the door 102. It is preferred to have a door such as the door 102, although for smaller parts a purge cover may be provided with only a small opening such as the opening 104 without a door. If the opening is small enough, sufficient positive pressure can still be created in the purge cover to prevent air from entering the purge cover.

The thermal distribution piece 34 has a side wall 106 and a top portion 108. An opening 110 is formed in the top portion 108. The side wall 106 is located adjacent the socket 14 and the top portion 108 is located above a top surface of the socket 14. Heat transfers through the thermal distribution piece 34 to or from the socket 14.

The thermal housing 48 has side walls 112 and a lower wall 114. A chamber 116 is defined jointly by the side walls 112, the lower wall 114, inner surfaces 118 of the gasket 46 and a lower surface of the printed circuit board 12. Threaded openings 120 and 122 are formed through the side walls 112. Pipe connectors 124 and 126 are screwed into the openings 120. A hot or cold fluid (liquid or gas) enters through the pipe connector 124 into the chamber 116 and leaves the chamber 116 through the pipe connector 126.

Figure 4A:
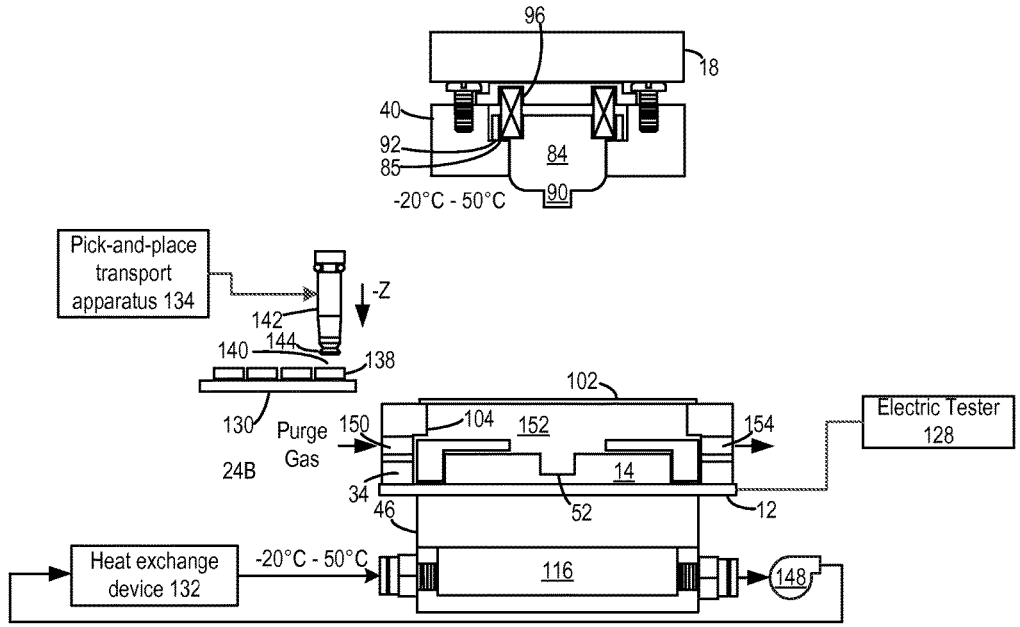
FIGS. 4a to 4g are cross-sectional side views illustrating functioning of the system.

FIG. 4a illustrates further components of the system 10 including an electric tester 128, a tape feeder 130, a heat exchange device 132 and a pick-and-place transport apparatus 134. The electric tester 128 is connected through leads in the printed circuit board 12 and socket 14 to the contacts at the electric machine interface 52. Electric signals can be transmitted between the electric tester 128 and the electric machine interface 52.

The tape feeder 130 holds a plurality of electronic devices 138. The tape feeder 130 is movable so that the electronic devices 138 are moved one at a time to an input and output station 140.

The pick-and-place transport apparatus 134 includes a pick up tip 142. As will be further understood by of ordinary skill in the art, the pick-and-place transport apparatus 134 further includes a mechanism and actuators to move the pick up tip 142 in x, y and z directions. The pick up tip 142 has a suction cup 144 at a lower end. A vacuum can be applied to the suction cup 144.

The heat exchange device 132 is located in a closed loop path that includes the chamber 116. The heat exchange device 132 may for example be a heater or a cooler that supplies a liquid or a gas to the chamber 116 at between −20° C. and 50° C. In the case of cooled liquid or gas, it is important to note that the chamber 116 may exist at a temperature below 0° C. Unlike air, the liquid or gas in the chamber 116 is selected so as not to cause any condensation or frost within the chamber 116 and, in particular, on a lower surface of the printed circuit board 12. In the case of a cooled liquid or gas, heat transfers from the electric machine interface 52 to the chamber 116. In the case of a heated liquid or gas, heat transfers from the chamber 116 to the electric machine interface 52. A pump 148 is located in line with the heat exchange device 132 and the chamber 116 to continuously circulate the liquid or gas through the heat exchange device 132 and the chamber 116. It may also be possible to exhaust air or water without the air or water being recirculated in a closed path.

The thermal head 84 is maintained at approximately the same temperature as the chamber 116. The thermal head 84 may for example have a passage therethrough through which a hot or cold liquid or gas can flow. Alternatively, the mounting plate 18 may be held at a cold or hot temperature and the mounting plate 18 may keep the thermal head 84 at such a hot or cold temperature. The mounting plate 18 may for example have a passage therethrough through which hot or cold liquid or gas flows. One of ordinary skill in the art will appreciate that other mechanisms for heating and cooling may be provided within the mounting plate 18 and/or the thermal head 84, such as a resistive heater or a Peltier device for cooling.

The door 102 closes the opening 104. A purge gas flows through an opening 150 into a cavity 152 over the electric machine interface 52. The purge gas leaves the cavity 152 through an opening 154. The purge gas may for example be nitrogen or another gas that does not cause condensation or frosting by any low temperatures that are created by the chamber 116 at the electric machine interface 52. The door 102 can be opened and closed for a short amount of time without causing unnecessary condensation or frosting at the electric machine interface 52.

Movement of various components, measuring parameters of the electronic devices and testing of the electronic devices 138 is now described with reference to FIGS. 4b to 4g. It should be understood in the description of FIGS. 4b through 4g that the chamber 116 and thermal head 84 remain at their respective low or high temperatures during such movement of the components and testing of the electronic devices 138.

Figure 4B:
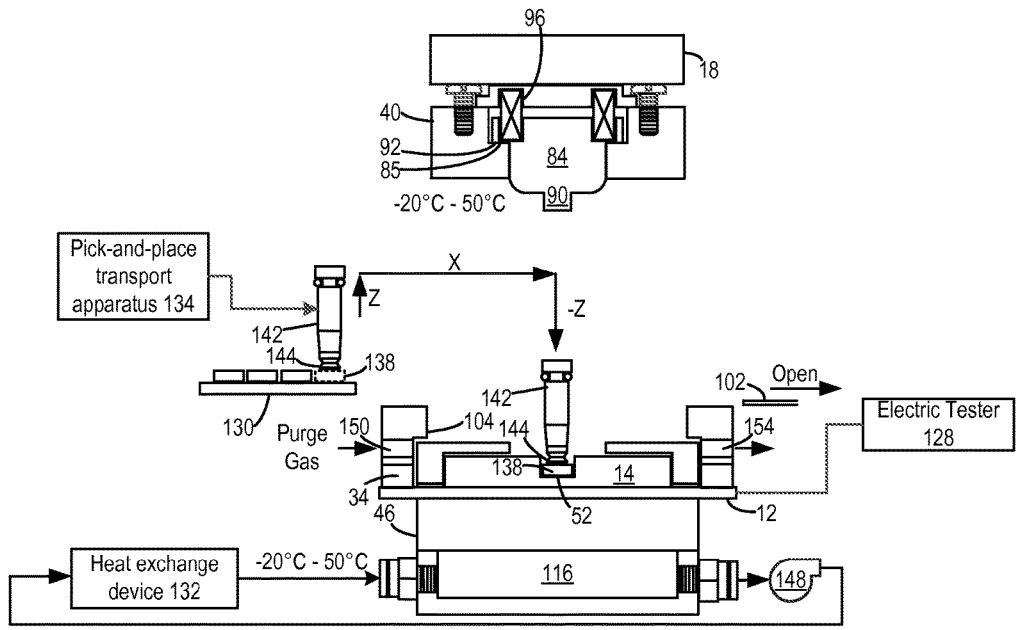

As shown in FIG. 4b, the mounting plate 18 and thermal head 84 are moved into an upper position. In the upper position, the pick-and-place transport apparatus 134 can move the pick up tip 142 into a space between the thermal head 84 and the socket 14. As shown in FIG. 4a, the pick up tip 142 first moves in a downward direction until the suction cup 144 makes contact with one of the electronic devices 138 at the input and output station 140. A vacuum is then applied to the suction cup 144 so that the electronic device 138 engages with the suction cup 144. As shown in FIG. 4b, the pick up tip 142 moves upward away from the input and output station 140, laterally and then down until the electronic device 138 is located on top of the electric machine interface 52. The vacuum is then released from the suction cup 144 and the pick up tip 142 then moves away from the socket 14 to leave the electronic device 138 on the electric machine interface 52. The pick up tip 142 then returns to its position shown in FIG. 4a.

Figure 4C:
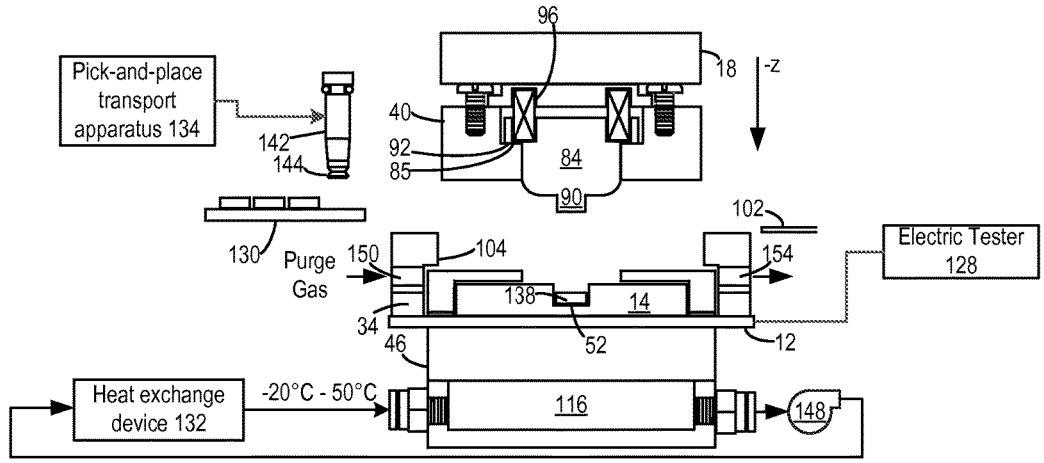
Figure 4D:
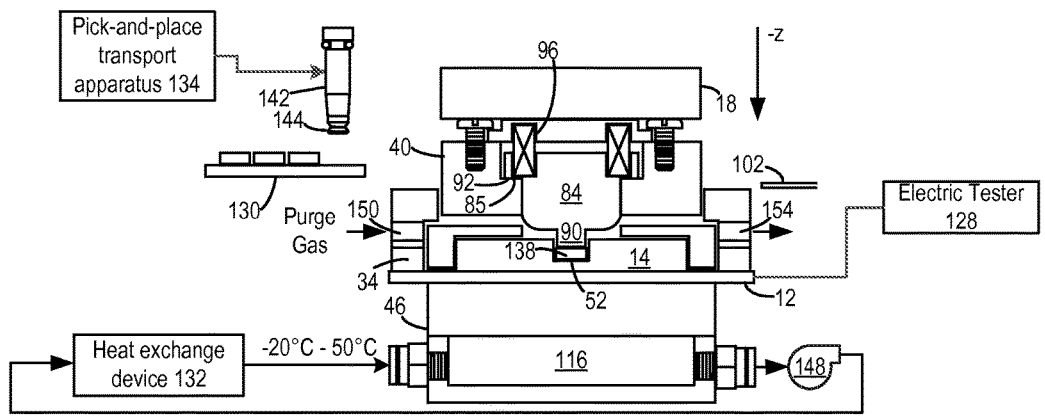

As shown in FIG. 4c, the mounting plate 18 is moved down so that the thermal head 84 blocks the space where the pick up tip 142 travels between the input and output station 140 and the electric machine interface 52. As shown in FIG. 4d, the mounting plate 18 continues to move down until the tip 90 contacts a top surface of the electronic device 138. The thermal plate 40 does not at this stage contact the thermal distribution piece 34.

Figure 4E:
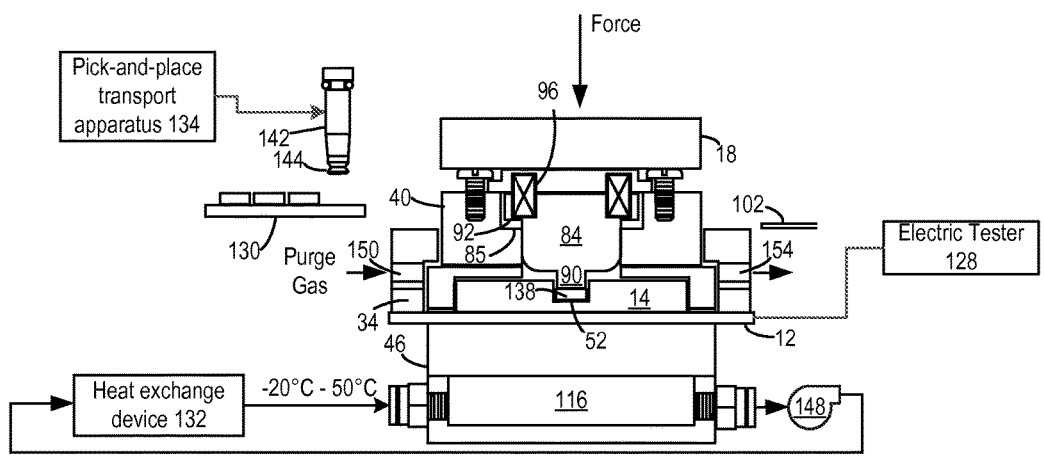

As shown in FIG. 4e, a force is created that moves the mounting plate 18 further down until the thermal plate 40 contacts the thermal distribution piece 34. The thermal head 84 simultaneously moves upwardly relatively into the thermal plate 40 against a spring force of the springs 96. The surface 92 lifts off and separates from the surface 85. The force that is created by the springs 96 ensures proper contact between the electronic device 138 and the contacts in the electric machine interface 52.

Heat can now transfer between the thermal head 84 and the electronic device 138. In the case of heating of the electronic device 138, the thermal head 84 heats the electronic device 138. Heat may also conduct through the thermal plate 40 to the thermal distribution piece 34 and from the thermal distribution piece 34 to the socket 14. A heated environment is thereby created for the socket 14. Alternatively, a cooled environment can be created for the socket 14 by heat conducting from the socket 14 through the thermal distribution piece 34 and thermal plate 40 to the thermal head 84 and/or mounting plate 18.

Because the chamber 116 and the thermal head 84 are both heated (or both cooled), a more even temperature profile is created over the electronic device 138 and the socket 14. A more even temperature profile allows for more accurate temperature of the electronic device 138 to be achieved and more predictability of the temperature of the electronic device 138.

When the electronic device 138 reaches its desired testing temperature, the electric tester 128 is used to test the electronic device 138 and/or measuring parameters of the electronic device 138 and/or programming the electronic device 138. Such testing and/or measuring parameters of the electronic device 138 and/or programming the electronic device 138 may only be conducted for a fraction of a second or for a couple of seconds.

Figure 4F:
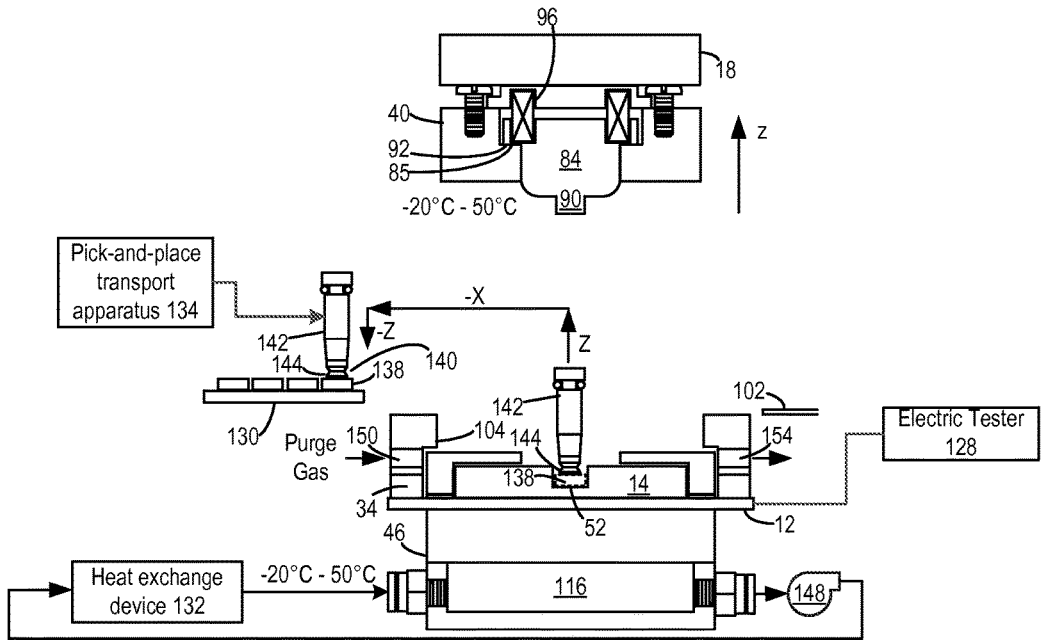

As shown in FIG. 4f, the mounting plate 18 and the thermal head 84 are moved into the upper position shown in FIG. 4a. The pick up tip 142 moves to the electronic device 138 on the electric machine interface 52 and the suction cup 144 makes contact with the electronic device 138. A vacuum is then applied to the suction cup 144 so that the electronic device 138 engages with the suction cup 144. The pick up tip 142 is then moved upward, sideways and downward until the electronic device 138 is again located at the input and output station 140. The suction cup 144 is then released from the electronic device 138 and the pick up tip 142 is slightly elevated.

Figure 4G:
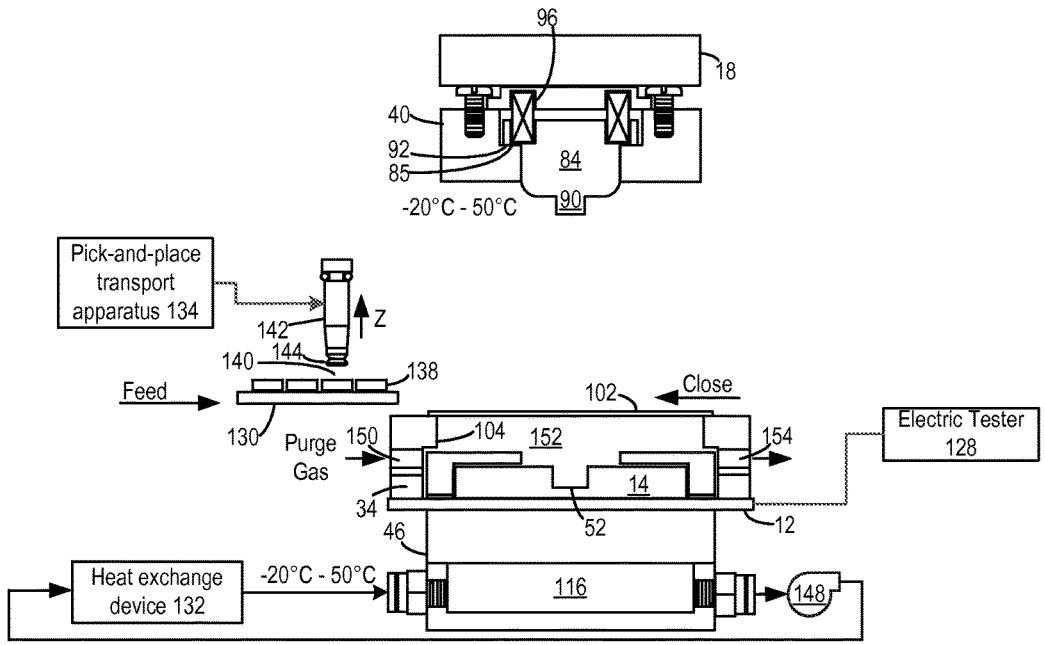

As shown in FIG. 4g, the door 102 closes the opening 104. Purge gas is used to clear any unwanted condensation or frost within the electric machine interface 52 that may have occurred due to the door 102 being open in FIGS. 4b to 4f. The tape feeder 130 moves laterally so that another electronic device 138 moves into the input and output station 140. The process described with reference to FIGS. 4a to 4f is then repeated with the new electronic device 138 located at the input and output station 140.

Figure 5:
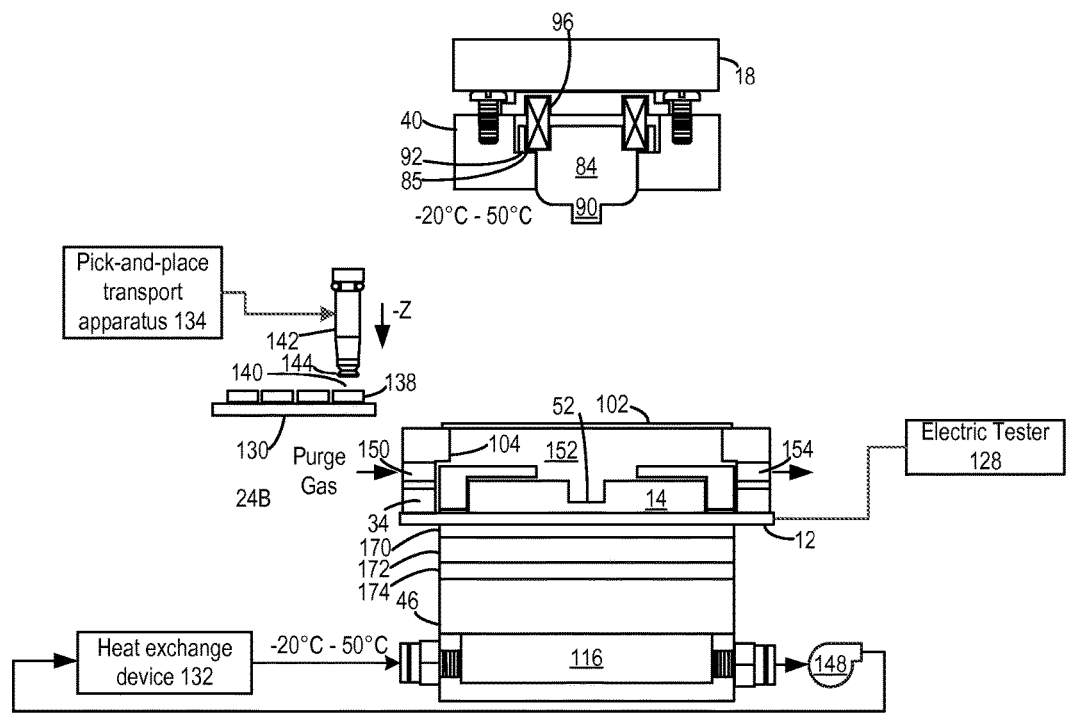
FIG. 5 is a cross-sectional side view of a system for analyzing electronic devices according to another embodiment of the invention.

FIG. 5 illustrates an embodiment that includes thermally conductive and electrically insulative gasket 170, a metal plate 170 and a Peltier device 172. The gasket 170 spaces the metal plate 170 from the printed circuit board 12 so that the metal plate 170 does not create short circuits in the printed circuit board 12. A cold side of the Peltier device is located against the thermal plate 172 so as to cool the thermal plate 172. The fluid in the chamber 116 cools a lower, hot side of the Peltier device 174.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A system for analyzing electronic devices, comprising:
   an input station configured to receive a plurality of electronic devices;
   a pick-and-place transport apparatus;
   an electric machine interface station, the pick-and-place transport apparatus having a pick up tip for engaging each of the electronic devices, transporting one electronic device of the plurality of electronic devices at a time from the input station to the electric machine interface station, disengaging from the electronic device, and moving away from the electronic device;
   an electric machine interface positioned to engage the electronic device when the electronic device is at the electric machine interface station, the pick up tip being movable for engaging the electronic device while at the electric machine interface station and transporting the electronic device away from the electric machine interface station to disengage at least one of the electronic devices at a time from the electric machine interface; and
   first and second thermal devices secured to a support structure on opposing sides of the electronic device when the electronic device is at the electric machine interface station to simultaneously transfer heat to or form the electronic device.

2. The system of claim 1, further including:
   a tape feeder that feeds the electronic devices to the input station where the pick up tip engages with the electronic devices.

3. The system of claim 2, wherein the input station is an input and output station and the pick up tip disengages from the electronic device at the input and output station after the electronic device is tested.

4. The system of claim 1, wherein the first thermal device includes a thermal head that is movable between a disengaged position to allow for the pick up tip to transport the electronic device to the electric machine interface station and an engaged position wherein after the pick up tip is moved away from the electric machine interface station, engages with the electronic device.

5. The system of claim 4, further comprising:
   a thermal distribution piece that is located around the electric machine interface station;
   a thermal plate located around the thermal head;
   a backing plate secured to the thermal plate with a body of the thermal head between portions of the thermal plate and the backing plate; and
   at least one spring between the thermal head and the backing plate, the spring biasing the thermal head so that a surface of the body of the thermal head rests on a surface of the thermal plate, a tip of the thermal head extending from the body of the thermal head making contact with the electronic device before the thermal plate makes contact with the thermal distribution piece, the thermal head moving towards the backing plate against a force of the spring until the thermal plate makes contact with the thermal distribution piece.

6. The system of claim 4, further comprising:
   a purge cover having an inlet and outlet located over the electric machine interface station.

7. The system of claim 6, wherein the purge cover includes:
   a main piece; and
   a door, the door being movable relative to the main piece between an open position and a closed position.

8. The system of claim 1, wherein the second thermal device includes:
   a thermal housing defining chamber having an inlet and an outlet;

a heat exchange device having an inlet and an outlet, an outlet of the heat exchange device being connected to the inlet of the chamber, heat transferring between a fluid in the chamber and the electronic device.

9. The system of claim 8, further comprising:

a printed circuit board; and a socket mounted to the printed circuit board, the socket defining the electric machine interface station.

10. The system of claim 9, further comprising:

an electric tester connected through the printed circuit board to contacts in the socket.

11. The system of claim 9 wherein the second thermal device includes a thermal housing, the thermal housing and a surface of the printed circuit board jointly defining the chamber.

12. The system of claim 1, wherein the first and second thermal device are heaters.

13. The system of claim 1, wherein the first and second thermal device are coolers.

14. The system of claim 13, wherein the first and second thermal devices cool the electronic device to below 0° C.

15. A method of analyzing electronic devices comprising:

engaging pick up tip of a pick-and place transport apparatus with each of a plurality of electronic devices;

transporting at least one of the electronic devices at a time with the pick up tip from an input station to an electric machine interface station;

disengaging the pick up tip from the electronic device;

moving the pick up tip away from the electronic device to allow for testing of the electronic device;

simultaneously transferring heat to and from first and second thermal components located on opposing sides of the respective electronic device when the respective electronic device is at the electric machine interface station;

communicating signals between an electric test and a circuit in the respective electronic device through the electric machine interface;

moving the pick up tip to the electronic device;

engaging the electronic device with the pick up tip while at the electric machine interface station; and transporting at least one of the electronic devices at a time with the pick up tip away from the electric machine interface station.

* * * * *